US009202552B2

(12) United States Patent
Paul et al.

(10) Patent No.: US 9,202,552 B2
(45) Date of Patent: Dec. 1, 2015

(54) DUAL PORT SRAM BITCELL STRUCTURES WITH IMPROVED TRANSISTOR ARRANGEMENT

(71) Applicant: GLOBALFOUNDRIES Inc., Grand Cayman (KY)

(72) Inventors: Bipul C. Paul, Clifton Park, NY (US); Randy W. Mann, Milton, NY (US); Sangmoon J. Kim, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 105 days.

(21) Appl. No.: 14/105,939

(22) Filed: Dec. 13, 2013

(65) Prior Publication Data

US 2015/0170735 A1 Jun. 18, 2015

(51) Int. Cl.
*G11C 11/00* (2006.01)
*G11C 11/412* (2006.01)
*G11C 8/16* (2006.01)

(52) U.S. Cl.
CPC ............... *G11C 11/412* (2013.01); *G11C 8/16* (2013.01)

(58) Field of Classification Search
CPC ................................ G11C 11/412; G11C 8/16
USPC ............................................... 365/154, 63, 51
See application file for complete search history.

(56) References Cited

U.S. PATENT DOCUMENTS

| 6,546,461 | B1 * | 4/2003 | Au et al. ........................ 711/131 |
| 7,738,282 | B2 * | 6/2010 | Liaw .............................. 365/154 |
| 8,009,463 | B2 * | 8/2011 | Liaw .............................. 365/154 |
| 8,183,639 | B2 * | 5/2012 | Malinge et al. ............... 257/368 |
| 8,492,215 | B2 * | 7/2013 | Yang et al. .................... 438/186 |
| 8,625,334 | B2 * | 1/2014 | Liaw .............................. 365/154 |
| 8,675,397 | B2 * | 3/2014 | Liaw .............................. 365/154 |
| 8,942,030 | B2 * | 1/2015 | Liaw .............................. 365/154 |
| 9,006,841 | B2 * | 4/2015 | Kumar et al. .................. 257/401 |
| 2013/0242644 | A1 * | 9/2013 | LIN et al. ...................... 365/154 |
| 2014/0185365 | A1 * | 7/2014 | Liaw, Jhon Jhy ............. 365/154 |
| 2015/0009750 | A1 * | 1/2015 | Schaefer et al. .............. 365/156 |

* cited by examiner

*Primary Examiner* — Viet Q Nguyen
(74) *Attorney, Agent, or Firm* — Heslin Rothenberg Farley & Mesiti P.C.; Kristian Ziegler (57) ABSTRACT

Dual port static random access memory (SRAM) bitcell structures with improve symmetry in access transistors physical placement are provided. The bitcell structures may include, for example, two pairs of parallel pull-down transistors. The bitcell structures may also include pass-gate transistors PGLA and PGRA forming a first port, and pass-gate transistors PGLB and PGRB forming a second port. The pass-gate transistors PGLA and PGLB may be adjacent one another and a first side of the bitcell structure, and pass-gate transistors PGRA and PGRB may be adjacent one another and a second side of the bitcell structure. Each of the pass-gate transistors PGLA and PGLB may be connected with one of the pull-down transistors of one of the pairs of parallel pull-down transistors. Similarly, each of the pass-gate transistors PGRA and PGRB may be connected with one of the pull-down transistors of the other pair of parallel pull-down transistors.

19 Claims, 6 Drawing Sheets

DUAL PORT SRAM BITCELL STRUCTURES WITH IMPROVED TRANSISTOR ARRANGEMENT

FIELD OF THE INVENTION

The present invention generally relates to dual port static random access memory (SRAM) bitcells, and more particularly, to dual port SRAM bitcells having improved symmetry in access transistor arrangement.

BACKGROUND OF THE INVENTION

Static random access memory (SRAM) bitcells are commonly used in integrated circuits. SRAM bitcells have the advantageous feature of holding data without requiring a refresh. Typically, an SRAM bitcell includes two pass-gate transistors, through which a bit can be read from or written into the SRAM cell. This type of SRAM bitcell is referred to as a single port SRAM bitcell. Another type of SRAM bitcell is referred to as dual port SRAM bitcell which includes four pass-gate transistors.

Figure 1:
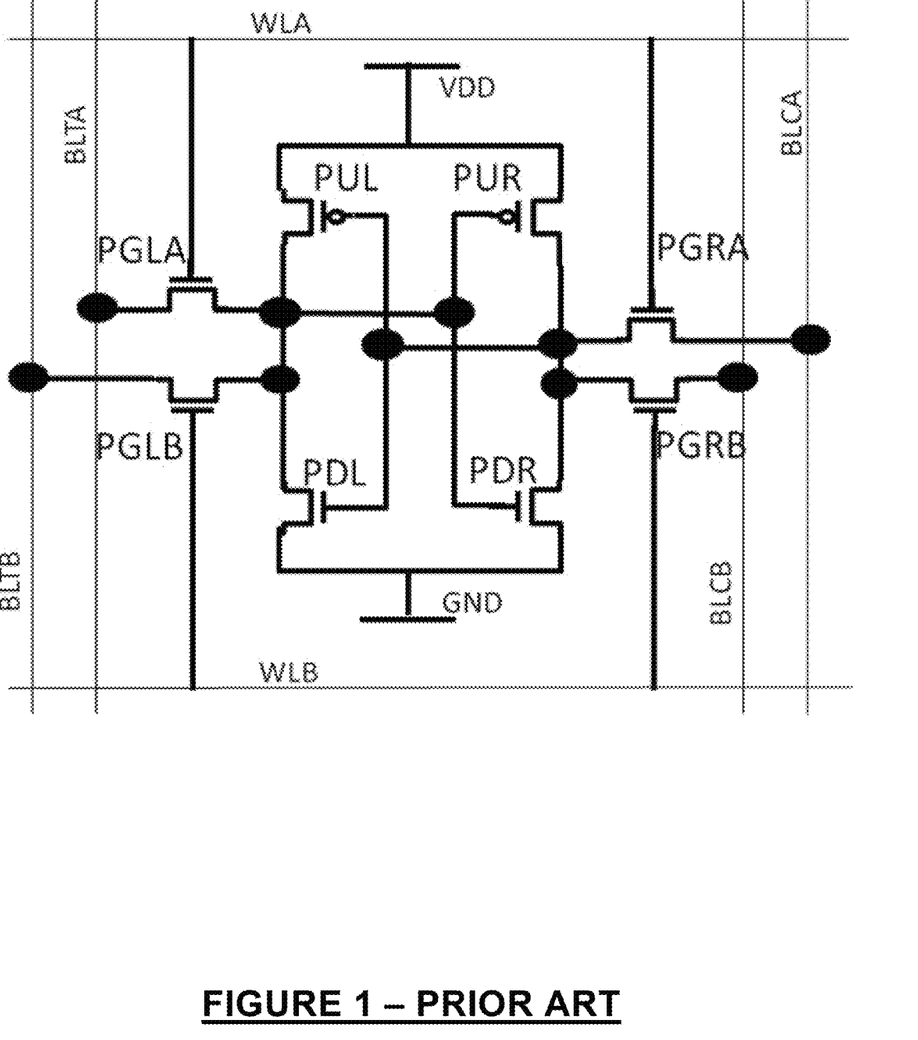
FIG. 1 illustrates a circuit diagram of an exemplary conventional dual port static random access memory (SRAM) bitcell.

FIG. 1 illustrates an exemplary circuit diagram of a typical eight-transistor dual port SRAM cell, which includes pull-up transistors PUL and PUR and pull-down transistors PDL and PDR. Pass-gate transistors PGLA and PGRA form a first port of the dual port SRAM cell. Pass-gate transistors PGLB and PGRB form a second port of the dual port SRAM cell. The gates of pass-gate transistors PGLA and PGRA are controlled by word-line WLA, while the gates of pass-gate transistors PGLB and PGRB are controlled by word-line WLB. A latch formed of pull-up transistors PUL and PUR and pull-down transistors PDR and PDL stores a bit. The stored bit can be read through bit-lines BLTA and BLCA by WLA, or through bit-lines BLTB and BLTCB by WLB. Conversely, a bit can be written into the SRAM bitcell through either WLA or WLB.

Advantageously, with two ports, the bit stored in the SRAM bitcell can be read from WLA and WLB simultaneously. This allows for parallel operations by different applications. Additionally, if a first SRAM bitcell and a second SRAM bitcell are in a same column or a same row, a read operation to the first SRAM bitcell can also be performed simultaneously with a write operation on the second SRAM cell.

Figure 2:
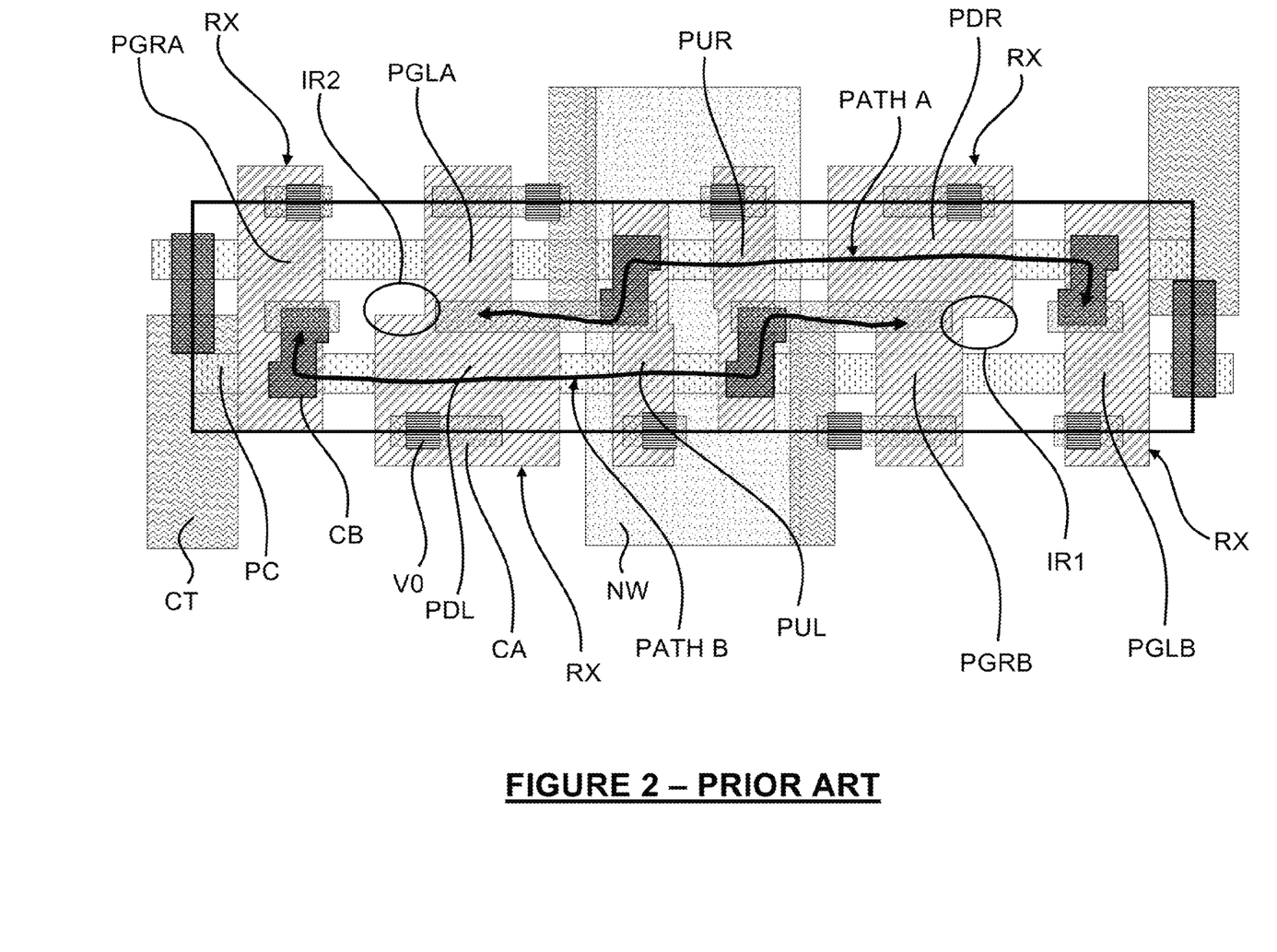
FIG. 2 illustrates a top view of an exemplary convention layout of the exemplary dual port SRAM bitcell shown in FIG. 1.

FIG. 2 shows the physical layout of exemplary typical dual port SRAM bitcells. As shown in FIG. 2, the physical positioning or arrangement of access transistors of typical dual port SRAM bitcells is not substantially symmetric or balanced. Specifically, as shown in FIG. 2, the pass-gate transistors PGLA and PGLB and pass-gate transistors PGRA and PGRB are not substantially symmetric or balanced over the layout of the bitcell. Such asymmetry or imbalance of the physical positioning or arrangement of access transistors in typical dual port SRAM bitcells results in asymmetry or imbalance in the electrical pathways or signals formed thereby. Further, asymmetry or imbalance of the physical positioning or arrangement of access transistors in typical dual port SRAM bitcells results in long pathways between the access transistors, and thereby reduced or compromised performance, as compared to dual port SRAM bitcells with a more symmetric or balanced physical layout. For example, typically transistor PGLB is physically spaced from transistors PGLA and PDL such that transistors PUL, PUR, PDR and PGRB are positioned therebetween. Further, transistors PDR and PGRB are physically adjacent transistor PGLB, while transistors PDL and PGLA are physically adjacent transistor PGRA (and pull-up transistors PUL and PUR are positioned between transistors PDR and PGRB and between transistors PDL and PGLA). As a result, as shown in FIG. 2 a relatively long conductive resistive path PATH A extends between transistor PGLB and transistors PGLA and PDL, and a relatively long conductive resistive path PATH B extends between transistor PGRA and transistors PGRB and PDR.

As also shown in FIG. 2, to support parallel operations, in which two ports may be at the "on" state at the same time, the pull-down transistors PDL and PDR of exemplary typical dual port SRAM bitcells each need to sustain twice the drive current of each of the pass-gate transistors (PGLA, PGRA, PGLB and PGRB). Accordingly, in conventional designs, the pull-down transistors PDL and PDR are designed wider (e.g., twice as wide) as pass-gate transistors PGLA, PGRA, PGLB and PGRB (along a common direction). As FIG. 2 illustrates, the active silicon or active regions RX of transistors PDL and PGLA, and transistors PDR and PGRB are typically L-shaped or T-shaped, with a wide portion for forming pull-down transistors PDL and PDR being significantly wider (e.g. twice as wide or even greater) than a narrow portion for forming pass-gate transistors PGLA and PGRB. Typical dual port SRAM bitcells include a difference in width between the transistors PDL and PGLA, and transistors PDR and PGRB, of at least about 80 nanometers. Due to optical effects, the intersection regions IR1 and IR2 between the wide portions and the narrow portions of the T-shaped active silicon or active regions RX of transistors PDL and PGLA, and transistors PDR and PGRB, respectively, are rounded (not shown). This difference in width between the active silicon or active regions RX forming transistors PDL and PGLA, and transistors PDR and PGRB, results aspect ratios of the pass-down to pass-gate portions equal to or greater than about 1:2. These relatively large aspect ratios of the active silicon or active regions RX of transistors PDL and PGLA, and transistors PDR and PGRB, increases variability, and impacts Vmin, which thereby affects SRAM bitcell performance (for example, if a misalignment occurs).

Thus, a need exists for dual port SRAM bitcells, and methods of forming same, incorporating improved symmetry in the physical layout of access transistors that shortens resistive pathways and decreases the aspect ratio of the active silicon or active regions RX forming transistors PDL and PGLA and transistors PDR and PGRB.

While certain aspects of conventional technologies have been discussed to facilitate disclosure of the invention, Applicants in no way disclaim these technical aspects, and it is contemplated that the claimed invention may encompass one or more of the conventional technical aspects discussed herein.

In this specification, where a document, act or item of knowledge is referred to or discussed, this reference or discussion is not an admission that the document, act or item of knowledge or any combination thereof was, at the priority date, publicly available, known to the public, part of common general knowledge, or otherwise constitutes prior art under the applicable statutory provisions; or is known to be relevant to an attempt to solve any problem with which this specification is concerned.

SUMMARY OF THE INVENTION

Briefly, the present invention satisfies the need for dual port SRAM bitcells, and methods of providing or forming same, incorporating improved symmetry in the physical layout of access transistors. Dual port SRAM bitcell embodiments provided herein provide for relatively short resistive pathways between access transistors. Dual port SRAM bitcell embodiments provided herein also provide relatively small pull-down to pass-gate transistor aspect ratios. Thereby, the dual port SRAM bitcells, and methods of forming same, disclosed herein provide for improved performance and reliability as compared to prior art dual port SRAM bitcells.

The present invention may address one or more of the problems and deficiencies of the art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

Certain embodiments of the presently-disclosed methods of forming a semiconductor device have several features, no single one of which is solely responsible for their desirable attributes. Without limiting the scope of these methods as defined by the claims that follow, their more prominent features will now be discussed briefly. After considering this discussion, and particularly after reading the section of this specification entitled "Detailed Description of the Invention," one will understand how the features of the various embodiments disclosed herein provide a number of advantages over the current state of the art. These advantages may include, without limitation, providing improved methods of forming semiconductor devices by, for example, incorporating improved low-k dielectrics having reduced dielectric constants.

These and other features and advantages of this invention will become apparent from the following detailed description of the various aspects of the invention taken in conjunction with the appended claims and the accompanying drawings.

DETAILED DESCRIPTION OF THE INVENTION

The present invention is generally directed to methods of forming semiconductor devices, and more particularly, to methods of forming semiconductor devices having a low-k dielectric.

Although this invention is susceptible to embodiment in many different forms, certain embodiments of the invention are shown and described. It should be understood, however, that the present disclosure is to be considered as an exemplification of the principles of this invention and is not intended to limit the invention to the embodiments illustrated.

Figure 3:
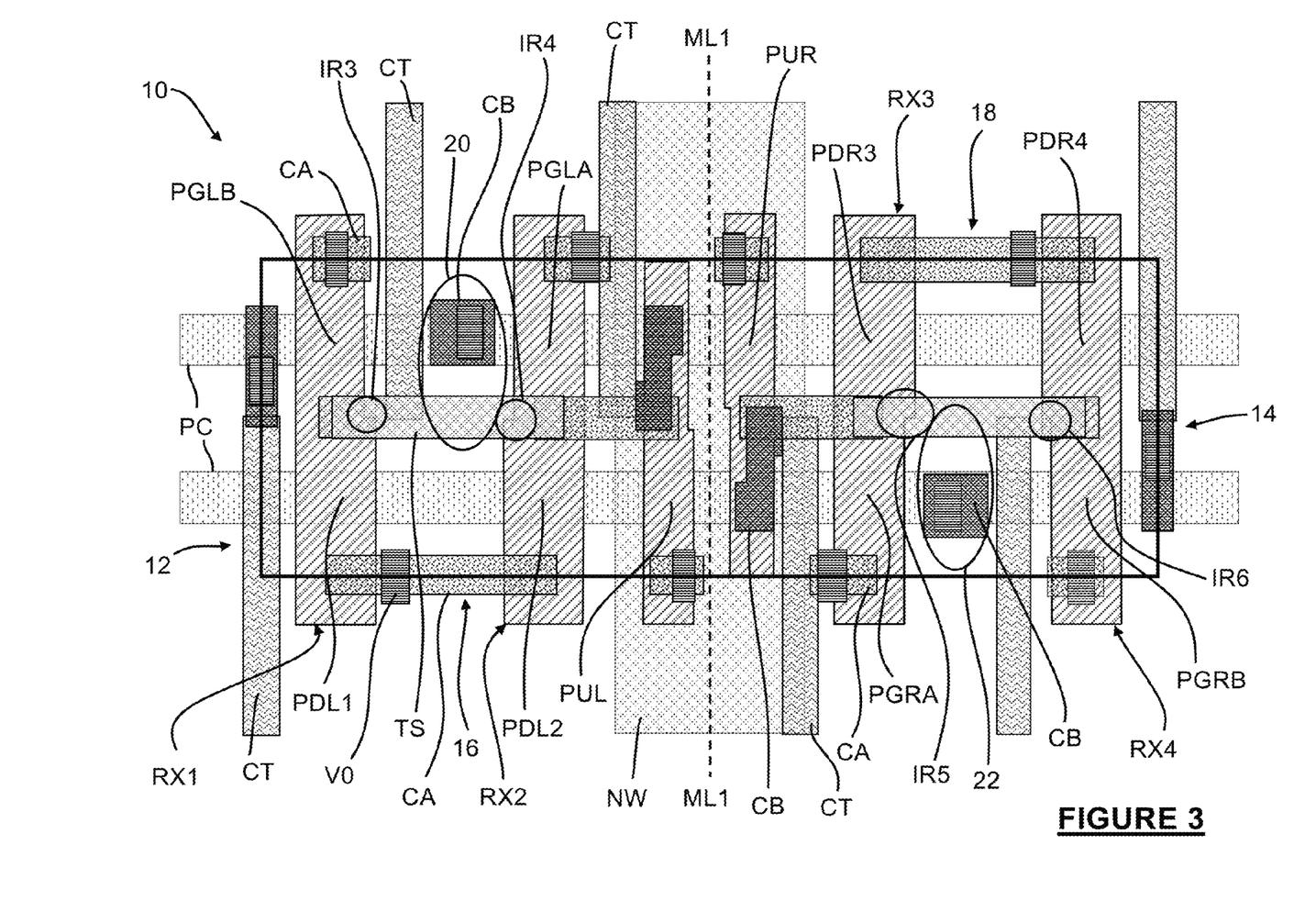
FIG. 3 illustrates a top view an exemplary layout of a dual port SRAM bitcell according to the present disclosure.

FIG. 3 shows a top plan view of an exemplary dual port static random access memory (SRAM) bitcell 10 according to the present disclosure. The exemplary SRAM bitcell 10 includes at least some of the same or similar components or aspects as the exemplary SRAM bitcell shown in FIGS. 1 and 2, and therefore the above description of the exemplary SRAM bitcell shown in FIGS. 1 and 2 equally applies to exemplary SRAM bitcell 10 except as otherwise noted or shown. Similarly, as the exemplary SRAM bitcell 10 includes at least some of the same or similar components or aspects as the exemplary SRAM bitcell shown in FIGS. 1 and 2, such common components or aspects are referenced in FIG. 3 (and FIGS. 3-6) using the same abbreviations as used above with reference to FIG. 2.

As FIG. 3 is a top plane view, the physical positioning or arrangement of the transistors and other components or aspects of the exemplary SRAM bitcell 10 will be discussed with respect to such a view. However, the positioning or arrangements discussed herein may equally apply to any other view or plane, and any direction terms used herein are used for reference purposes only and are not meant in a limiting sense. As shown in FIG. 3, the bitcell 10 occupies a substantially rectangular cell area. As also shown in FIG. 3, the exemplary SRAM bitcell 10 includes pass-gate transistors PGLB and PGLA are adjacent to one another at a first side or end 12 of the SRAM bitcell 10. The pass-gate transistor PGLB is positioned proximate the first side or end 12 of the bitcell 10, and the pass-gate transistor PGLA is positioned distal the first side or end 12 of the exemplary SRAM bitcell 10 (or, stated differently, proximate a second end or side 14 that substantially opposes the first side or end 12). In some embodiments, the pass-gate transistor PGLA is positioned adjacent to the pass-gate transistor PGLB on an interior (i.e., toward the center of the SRAM bitcell 10) side of the pass-gate transistor PGLB. The pass-gate transistor PGLA is also positioned adjacent to the pull-up transistors PUL and PUR, which are proximate the second end 14 of the SRAM bitcell 10, as shown in FIG. 3. Specifically, the gate transistor PGLA is positioned immediately adjacent the pull-up transistor PUL in a direction generally extending from the first end 12 to the second end 14 of the SRAM bitcell 10 and proximate the first side 12. The pull-up transistor PUL is positioned adjacent the pull-up transistor PUR on the second end 14 side of the SRAM bitcell 10 in a direction generally extending from the first end 12 to the second end 14 of the SRAM bitcell 10. Thereby, the pass-gate transistor PGLA is positioned or arranged substantially between the gate transistor PGLB and the pull-up transistor PUL in a direction generally extending from the first end 12 to the second end 14 of the SRAM bitcell 10.

As also shown in FIG. 3, the exemplary SRAM bitcell 10 includes the pull-down transistors PDL and PDR as a pair of parallel transistors. Specifically, the first and second active regions RX1 and RX2 forming the pass-gate transistors PGLB and PGLA, respectively, also form first and second pull-down PDL1 and PDL2 transistors, respectively. The first and second pull-down PDL1 and PDL2 transistors are coupled in parallel. Similarly the third and fourth active regions RX3 and RX4 forming the pass-gate transistors PGRB and PGRA, respectively, also form third and fourth pull-down PDR1 and PDR2 transistors, respectively. The third and fourth pull-down PDR1 and PDR2 transistors are coupled in parallel. In this way, as compared to the prior art exemplary SRAM bitcell shown in FIGS. 1 and 2, the exemplary SRAM bitcell 10 includes the pass-gate transistor PGLB adjacent the pass-gate transistor PGLA, and the pull-down transistor PDL is split into first and second parallel pull-down transistors PDL1 and PDL2 associated with the pass-gate transistors PGLB and PGLA, respectively. Similarly, as compared to the prior art exemplary SRAM bitcell shown in FIGS. 1 and 2, the exemplary SRAM bitcell 10 includes the pass-gate transistor PGRA adjacent the pass-gate transistor PGRB, and the pull-down transistor PDR is split into third and fourth parallel pull-down transistors PDR3 and PDR4 associated with the pass-gate transistors PGRA and PGRB, respectively.

Stated differently, the exemplary SRAM bitcell 10 includes two pairs of parallel pull-down transistors (PDL1-PDL2 and PDR3-PDR4) replacing the two pull-down transistors (PDL and PDR) of typical SRAM bitcells, as shown in FIG. 3. The pass gate transistors (PBLB, PGLA, PGRA and PGRB), pull down transistors (PDL1, PDL2, PDR3 and PDR4) and pull-up transistors (PUL and PUR) may all be formed on the same layer of the bitcell 10. As also shown in FIG. 3, the exemplary SRAM bitcell 10 is substantially physically balanced along a first direction. The exemplary SRAM bitcell 10 includes pass-gate transistors, pull-down transistors and pull-up transistors symmetrically disposed, positioned or arranged along a first direction extending from the first side 12 to the second side 14 of the SRAM bitcell 10. Specifically, the exemplary SRAM bitcell 10 includes the PGLB and PDL1 transistors positioned adjacent the first side of 12 of the bitcell 10, the PGRB and PDR4 transistors positioned adjacent the second side of 14 of the bitcell 10, and the PGLB and PDL1 transistors and the PGRB and PDR4 transistors are each positioned substantially the same distance from a midline M1-M1 defining the center of the bitcell 10 along a direction extending from the first side 12 to the second side 14 (i.e., the midline extends perpendicular to a direction extending from the first side 12 to the second side 14 at the center of the bitcell 10).

The exemplary SRAM bitcell 10 also includes the PGLA and PDL2 transistors positioned adjacent the PGLB and PDL1 transistors proximate the midline M1-M1 of the bitcell 10, and the PGRA and PDR3 transistors are positioned adjacent the PGRB and PDR4 transistors proximate the midline M1-M1 of the bitcell 10. Each of the PGLA and PDL2 transistors and PGRA and PDR3 transistors are positioned substantially the same distance from the midline M1-M1 of the bitcell 10. Still further, the exemplary SRAM bitcell 10 also includes the pull-up PUL and PUR transistors positioned immediately between the midline M1-M1 and the PGLA and PDL2 transistors and the PGRA and PDR3 transistors, respectively, and each pull-up transistor is positioned substantially the same distance from the midline M1-M1 of the bitcell 10. As also shown in FIG. 3, other components of the exemplary SRAM bitcell 10 are also positioned symmetrically about the midline M1-M1 (i.e., positioned symmetrically along a direction extending from the first side 12 to the second side 14 of the bitcell 10 about the midline M1-M1), such as the contacts to gate (CBs), contacts to source/drain (CAs), CTs, vias (V0s) and trench cell sites (TSs). In this way, the components of the exemplary bitcell 10, including transistors, contacts, via, etc., are positioned or arranged such that matching or similar components are symmetrically disposed about the midline M1-M1 at the center of the longer length of the bitcell 10 extending from the first side 12 of the second side 14 of the bitcell 10.

As the exemplary SRAM bitcell 10 includes each pull-down transistor PDL and PDR that is typically associated with the pass-gate transistors PGLA and PGRB as two separate and distinct parallel pull-down transistors (first and second pull-down transistors PDL1 and PDL2, and third and fourth pull-down transistors PDR3 and PDR4, respectively), the active silicon or active regions RX forming the "split" pull-down transistors PDL1, PDL2, PDR3 and PDR4 can be similar in width to the associated pass-gate transistors PGLB, PGLA, PGRA and PGRB. In this way, the SRAM bitcell 10 can perform parallel operations with the same or greater efficiency and/or capability as compared to prior art SRAM bitcells. As shown in FIG. 3, the transistors PDL1 and PGLB (formed by RX1) and the transistors PDL2 and PGLA (formed by RX2) proximate the first side 12 of the bitcell 10 are L-shaped or T-shaped with a wide portion forming pull-down transistors PDL1 and PDL2 being only slightly wider than a narrower portion for forming pass-gate transistors PGLB and PGLA, respectively. Similarly, as also shown in FIG. 3, the transistors PDR3 and PGRA (formed by RX3) and the transistors PDR4 and PGRB (formed by RX4) proximate the second side 14 of the bitcell 10 are T-shaped or L-shaped with a wide portion forming pull-down transistors PDR3 and PDR4 being only slightly wider than a narrower portion for forming pass-gate transistors PGRA and PGRB, respectively. In some embodiments of the exemplary SRAM bitcell 10, the pull-down transistors (PDL1, PDL2, PDR3 and PDR4) are less than or equal to about 25 nanometers wider than the pass-gate transistors associated therewith (PGLB, PGLA, PGRA and PGRB). In some embodiments of the exemplary SRAM bitcell 10, the pull-down transistors (PDL1, PDL2, PDR3 and PDR4) are less than or equal to about 20 nanometers wider than the pass-gate transistors associated therewith (PGLB, PGLA, PGRA and PGRB). In some embodiments of the exemplary SRAM bitcell 10, the pull-down transistors (PDL1, PDL2, PDR3 and PDR4) are less than or equal to about 15 nanometers wider than the pass-gate transistors associated therewith (PGLB, PGLA, PGRA and PGRB). In some embodiments of the exemplary SRAM bitcell 10, the pull-down transistors (PDL1, PDL2, PDR3 and PDR4) are less than or equal to about 12 nanometers wider than the pass-gate transistors associated therewith (PGLB, PGLA, PGRA and PGRB). In some embodiments, the intersection regions IR3-IR6 between the wide portions and the narrow portions of the active silicon or active regions RX3, RX4, RX5 and RX6 forming the pull-down transistors PDL1, PDL2, PDR3 and PDR4 and pass-gate transistors PGLB, PGLA, PGRA and PGRB, respectively, are rounded (not shown).

The exemplary SRAM bitcell 10 includes a relatively large beta-ratio (ion(pull-down)/ion(pass-gate)) due to the symmetry of the pass-gate and pull down structures (e.g., RX3, RX4, RX5 and RX6). In some embodiments, the exemplary SRAM bitcell 10 includes a beta-ratio better than or equal to about 1:1.3. In some embodiments, the exemplary SRAM bitcell 10 includes a beta-ratio better than or equal to about 1:1.25. In some embodiments, the exemplary SRAM bitcell 10 includes a beta-ratio better than or equal to about 1:1.18. In some embodiments, the exemplary SRAM bitcell 10 includes a beta-ratio better than or equal to about 1:1.15. Such improved beta-ratios provide enhanced performance over prior art bitcells. As discussed above, the exemplary SRAM bitcell 10 includes pairs of parallel pull-down transistors (PDL1-PDL2 and PDR3-PDR4) that replace the conventional PDL and PDR transistors. As pairs of pull-down transistors are utilized (as opposed to single transistors), the width of each pull-down transistor in a first direction extending from a first side 12 to a second side 12 of the bitcell 10 can be minimized such that the width of each pull-down transistor in the first direction is substantially similar to the width of the corresponding pass-gate transistors (as discussed above). In some embodiments, the length of each pull-down transistor in a second direction extending from a third side 16 to an opposing fourth side 18 of the bitcell 10 that extend between the first and second sides 12, 14 thereof can be minimized such that the length of each pull-down transistor in the second direction is substantially similar to the length of the corresponding pass-gate transistors. In such a way, each pair of corresponding pass-gate and pull-down transistors (PGLB-PDL1, PGLA-PDL2, PGRA- PDR3 and PGRB-PDR4) is a more symmetric structure (e.g., each RX3, RX4, RX5 and RX6) as compared to prior art structures. In this way, the exemplary SRAM bitcell 10 can provide for a relatively large beta-ratio as compared to prior bitcells. For example, as described above, the exemplary SRAM bitcell 10 may provide for active regions (e.g., RX1, RX2, RX3 and RX4) with aspect ratios of the pass-down to pass-gate portions better than or equal to about 1:1.3, and preferably better than or equal to about 1:1.25.

With reference to FIG. 3, the exemplary SRAM bitcell 10 includes a contact to gate (CB) positioned between RX1 (forming PGLB and PDL1) and RX2 (forming PGLA and PDL2) and extending substantially in a first direction extending from the first side 12 to the second side 14 thereof. In some such embodiments, the CB positioned between RX1 and RX2 may comprise a word or bit line contact. In the exemplary layout of FIG. 3, the CB positioned between RX1 and RX2 extends substantially parallel to a polysilicon conductor (PC) construct positioned in a layer beneath the contact CB. Similarly, the exemplary SRAM bitcell 10 also includes a CB positioned between RX3 (forming PGRA and PDR3) and RX4 (forming PGRB and PDR4) that extends substantially in the first direction. In some embodiments, the CB positioned between RX3 and RX4 may comprise a word or bit line contact. In the exemplary layout of FIG. 3, the CB positioned between RX3 and RX4 extends substantially parallel to a polysilicon conductor (PC) construct positioned in a layer beneath the contact CB.

In the embodiment shown in FIG. 3, the exemplary SRAM bitcell 10 includes a first CB-TS pass-through 20 for internal node connection. In some embodiments, a CB-TS pass-through 20 for internal node connection is provided with the CB positioned between RX1 (forming PGLB and PDL1) and RX2 (forming PGLA and PDL2) in a first direction extending from the first side 12 to the second side 14 of the bitcell 10, and the TS extending between the between RX1 and RX2 in the first direction. In some such embodiments, the CB of the first CB-TS pass-through 20 may comprise a word line contact. Similarly, in some embodiments the exemplary SRAM bitcell 10 includes a second CB-TS pass-through 22 for internal node connection provided with the CB positioned between RX3 (forming PGRA and PDR3) and RX4 (forming PGRB and PDR4) in the first direction, and the TS extending between the between RX1 and RX2 in the first direction. In some such embodiments, the CB of the second CB-TS pass-through 22 may comprise a word line contact. In some embodiments, the exemplary SRAM bitcell 10 includes both the first CB-TS pass-through 20 and the second CB-TS pass-through 22.

Figure 4:
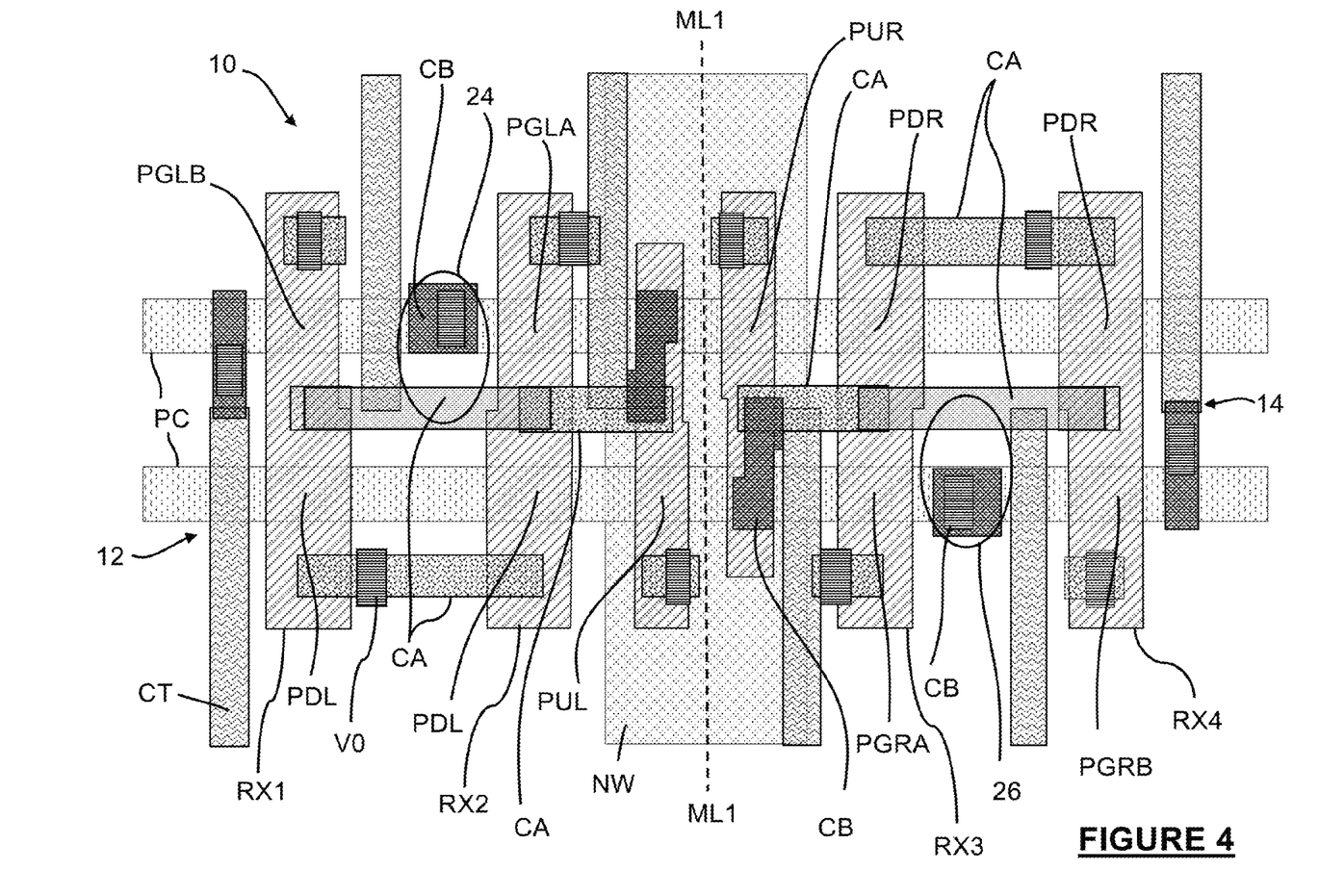
FIG. 4 illustrates a top view an exemplary layout of a dual port SRAM bitcell according to the present disclosure.

As shown in FIG. 4, in some embodiments the exemplary SRAM bitcell 10 includes one or more pass-through for internal node connection other than, or in addition to, the first and second CB-TS pass-through 20, 22 discussed above. For example, the exemplary SRAM bitcell 10 shown in FIG. 4 includes a first CA-CB pass-through 24 for internal node connection. In some embodiments, the first CA-CB pass-through 24 for internal node connection is provided with the CB positioned between RX1 (forming PGLB and PDL1) and RX2 (forming PGLA and PDL2) in a first direction extending from the first side 12 to the second side 14 of the bitcell 10, and a contact to source/drain (CA) extending between RX1 and RX2 in the first direction. In some such embodiments, the CB of the first CA-CB pass-through 24 may comprise a word or bit line contact. Similarly, in some embodiments the exemplary SRAM bitcell 10 includes a second CA-CB pass-through 26 for internal node connection. The second CA-CB pass-through 26 may be formed by the CB positioned between RX3 (forming PGRA and PDR3) and RX4 (forming PGRB and PDR4) in the first direction, and the CA extending between RX1 and RX2 in the first direction. In some such embodiments, the CB of the second CA-CB pass-through 26 may comprise a word or bit line contact. In some embodiments, the exemplary SRAM bitcell 10 includes both the first CA-CB pass-through 24 and the second CA-CB pass-through 26.

Figure 5:
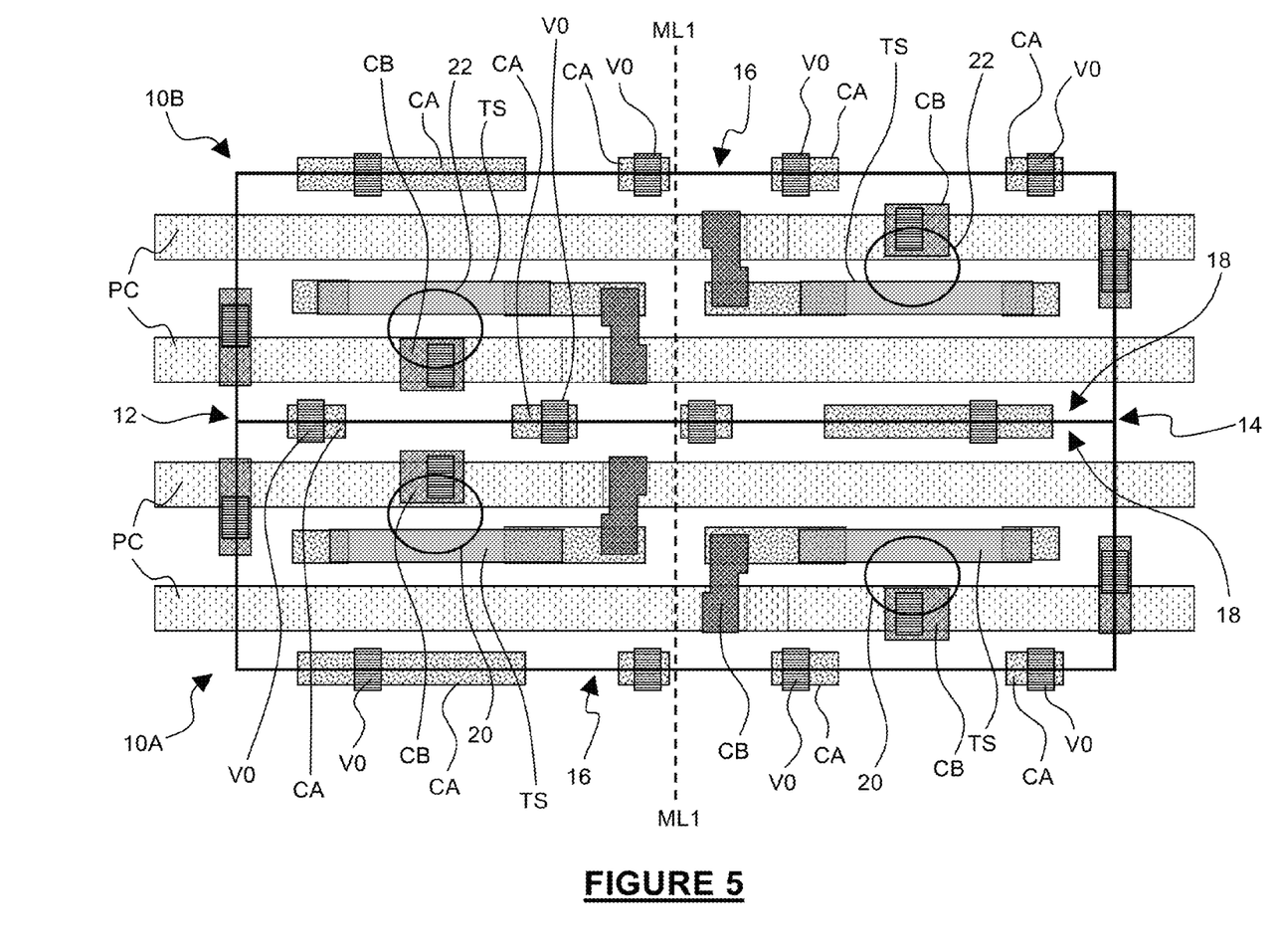
FIG. 5 illustrates a top view an exemplary layout of a dual port SRAM bitcell according to the present disclosure.

The bitcell layouts of the present disclosure also optimize CB-TS or CA-CB pass throughs for internal node connection (as shown in FIGS. 3 and 4) of each bitcell, and also CB-CB spacing of the CBs of the CB-TS or CA-CB pass throughs of adjacent or adjoining bitcells. For example, FIG. 5 illustrates two interconnected exemplary bitcells 10A, 10B that each include the bitcell 10 layout of FIG. 3 (i.e., CB-TS pass throughs 20, 22 for internal node connection). As shown in FIG. 5, the adjacent first and second bitcells 10A, 10B are oriented in a mirrored relationship along the fourth sides 18 of the bitcells 10A, 10B. In this way, the first and second bitcells 10A, 10B share several CAs and corresponding V0s along the fourth sides 18 of the bitcells 10A, 10B. The "shared" CAs and corresponding V0s along the fourth sides 18 of the bitcells 10A, 10B may be spaced from the CBs (and V0s) of the proximate CB-TS pass through 20 (or CA-CB pass through, if utilized) at least in a third direction extending from the third side 16 to the fourth side 18 of the bitcells 10A, 10B. In this way, although the CBs of the CB-TS pass throughs 20, 20 (or CA-CB pass throughs, if utilized) that are positioned adjacent the fourth sides 18 of the bitcells 10A, 10B are adjacent to one another in the third direction, the respective CBs of the CB-TS pass throughs 20, 20 (or CA-CB pass throughs, if utilized) of the first and second bitcells 10A, 10B are sufficiently or optimally spaced from one another in the third direction. As also shown in FIG. 5, the layout of bitcells 10A, 10B also provides sufficient or optimal spacing in the third direction between the V0s associated with the CBs of the CB-TS pass throughs (or CA-CB pass throughs, if utilized).

As also shown in FIG. 5, each of the bitcells 10A, 10B also includes CAs and corresponding V0s along the third side 16 of the bitcells 10A, 10B. The CAs (and V0s) along the third sides 16 of the bitcells 10A, 10B are spaced from the CB (and V0s) of the proximate CB-TS pass through 22 (or CA-CB pass through, if utilized) at least in a fourth direction extending from the fourth side 18 to the third side 16 of the bitcells 10A, 10B. In this way, if additional bitcells (not shown) with sustainably the same layout of bitcells 10A and 10B are positioned adjacent to bitcells 10A, 10B along the third sides 16 thereof in a mirrored relationship, respectively, such that the CAs (and V0s) along the third sides 16 of the adjacent bitcells were "shared," the CBs of the CB-TS pass throughs 22 (or CA-CB pass throughs, if utilized) of the bitcells would be sufficiently or optimally spaced from one another in the fourth direction. Similarly, in such an arrangement the layout of the bitcells would also provide for sufficient or optimal spacing in the fourth direction between the V0s associated with the CBs of the CB-TS pass throughs 22 (or CA-CB pass throughs, if utilized).

Figure 6:
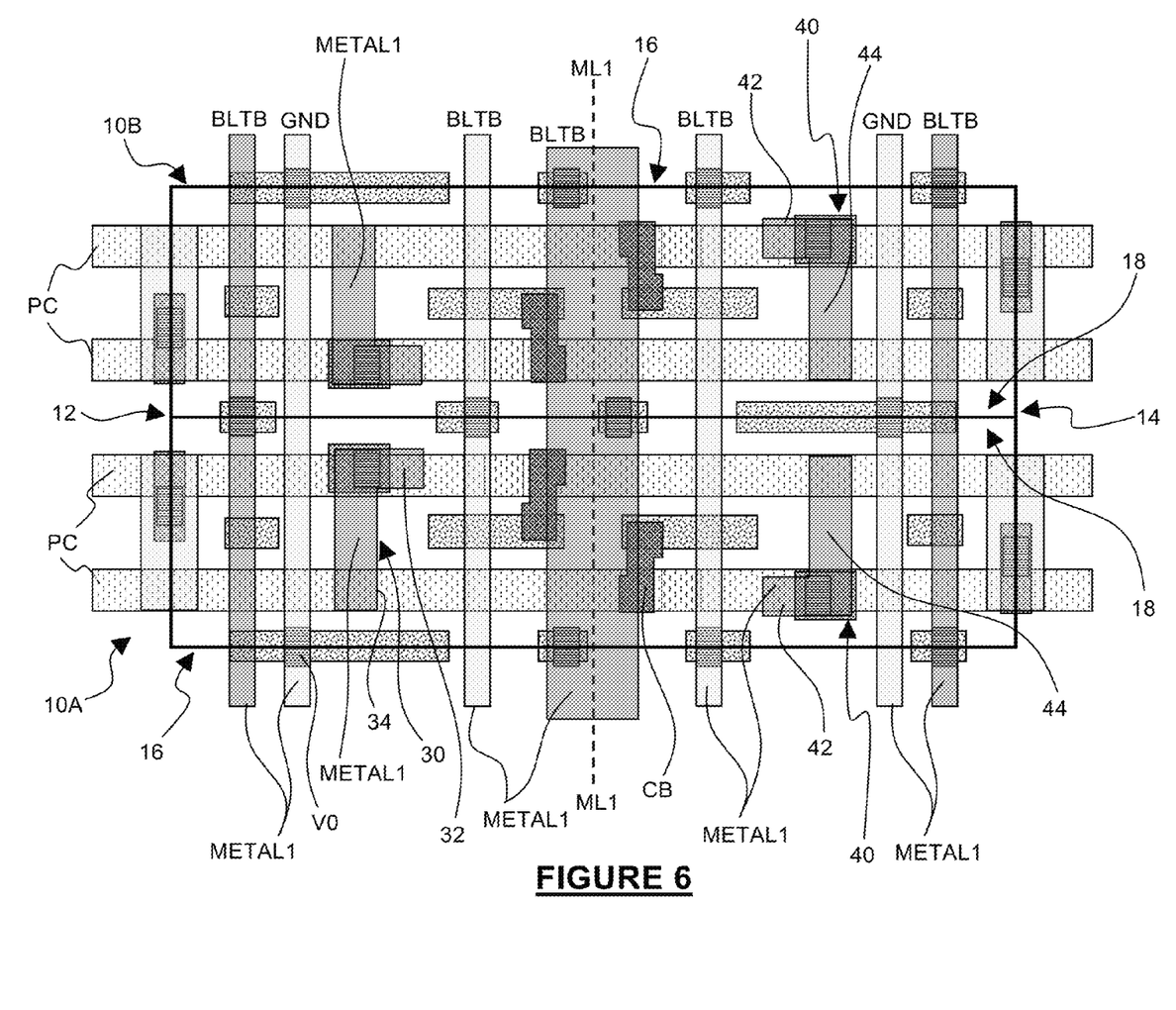
FIG. 6 illustrates a top view an exemplary layout of a dual port SRAM bitcell according to the present disclosure.

The present disclosure also provides for interconnected transistors through the use of metal layers that are optimized to further provide for the symmetrical bitcell layouts disclosed herein. As shown in FIG. 6, in some embodiments V0s are used to connect metal layers, such as a metal 1 layer, to the local interconnects. In some embodiments, a metal 1 layer includes first and second metal members 30, 40 that are coupled to, or associated with, the V0 associated with the CB of the first and second CB-TS or CA-CB pass throughs, respectively (see FIGS. 3 and 4). As shown in FIG. 6, the first and second metal members 30, 40 may be L-shaped such that a first portion 32, 42 extends parallel to the CB of the first and second CB-TS or CA-CB pass throughs and/or PC. In some embodiments, the first portion 32, 42 of the first and second metal members 30, 40 extends in a direction extending between the first side 12 and the second side 14 of the bitcell. As also shown in FIG. 6, the L-shaped first and second metal members 30, 40 of the metal 1 layer may include a second portion 34, 44 that extends in a direction set at an angle with respect to the first portion 32, 42. In some embodiments, the second portion 34, 44 of the first and second metal members 30, 40 may extend in a direction that is substantially perpendicular to the orientation of the respective first portion 32, 42. In some embodiments, the second portion 34, 44 of the first and second metal members 30, 40 extends in a direction extending between the third side 16 and the fourth side 18 of the bitcell. In this way, the first portion 32, 42 and second portion 34, 44 of the first and second metal members 30, 40 may form an "L" shape. The L-shape of the first and second metal members 30, 40 of the metal 1 layer advantageously provide minimum area constraints of the first and second metal members 30, 40 (the metal 1 portions that are associated with the CBs utilized as pass-throughs). The L-shape of the first and second metal members 30, 40 of the metal 1 layer also advantageously provides sufficient spacing between other members of the metal 1 layer, such as a ground metal portion and a metal portion corresponding to bit-line BLTA. The L-shape of the first and second metal members 30, 40 of the metal 1 layer further advantageously provides for a bitcell 10 size that meets or exceeds industry constraints.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "comprising" and "including" or grammatical variants thereof are to be taken as specifying the stated features, integers, steps or components but do not preclude the addition of one or more additional features, integers, steps, components or groups thereof. This term encompasses the terms "consisting of" and "consisting essentially of".

The phrase "consisting essentially of" or grammatical variants thereof when used herein are to be taken as specifying the stated features, integers, steps or components but do not preclude the addition of one or more additional features, integers, steps, components or groups thereof but only if the additional features, integers, steps, components or groups thereof do not materially alter the basic and novel characteristics of the claimed composition, device or method.

While several aspects and embodiments of the present invention have been described and depicted herein, alternative aspects and embodiments may be affected by those skilled in the art to accomplish the same objectives. Accordingly, this disclosure and the appended claims are intended to cover all such further and alternative aspects and embodiments as fall within the true spirit and scope of the invention.

The invention claimed is:

1. A dual port static random access memory (SRAM) bitcell structure comprising:
    a substantially rectangular cell area having a relatively longer dimension of the cell area extend between a first side of the bitcell structure to a second side of the bitcell structure;
    pass-gate transistors PGLA and PGRA forming a first port;
    pass-gate transistors PGLB and PGRB forming a second port; and
    a latch formed of pull-up transistors PUL and PUR and pull-down transistors PDR and PDL configured to store a bit,
    transistor PGLB being adjacent the first side of the bitcell structure, and transistor PGLA being adjacent transistor PGLB in a first direction extending from the first side to the second side of the bitcell structure,
    transistor PGRB being adjacent the second side of the bitcell structure, and transistor PGRA being adjacent transistor PGRB in a second direction extending from the second side to the first side of the bitcell structure, and
    pass-gate transistors PGLA, PGRA, PGLB and PGRB, pull-up transistors PUL and PUR and pull-down transistors PDR and PDL being formed on the same layer.

2. The bitcell structure of claim 1, wherein the pass-gate transistors PGLB and PGRB form substantially the same size and shape and are symmetrically disposed along the relatively longer dimension of the substantially rectangular cell area about a midline extending through the middle of the relatively longer dimension of the substantially rectangular cell area, and wherein the pass-gate transistors PGLA and PGRA form substantially the same size and shape and are symmetrically disposed along the relatively longer dimension of the substantially rectangular cell area about the midline.

3. The bitcell structure of claim 1, wherein pull-down transistors PDL include a pair of parallel transistors PDL1 and PDL2, and wherein pull-down transistors PDR include a pair of parallel transistors PDR3 and PDR4.

4. The bitcell structure of claim 3, wherein transistor PDL1 is adjacent the first side of the bitcell structure, and transistor PDL2 is adjacent transistor PDL1 in the first direction, and wherein transistor PDR4 is adjacent the second side of the bitcell structure, and transistor PDR3 is adjacent transistor PDR4 in the second direction.

5. The bitcell structure of claim 4, wherein the pull-down transistors PDL1 and PDR4 form substantially the same size and shape and are symmetrically disposed along the relatively longer dimension of the substantially rectangular cell area about a midline extending through the middle of the relatively longer dimension of the substantially rectangular cell area, and wherein the pull-down transistors PDL2 and PDR3 form substantially the same size and shape and are symmetrically disposed along the relatively longer dimension of the substantially rectangular cell area about the midline.

6. The bitcell structure of claim 1, wherein a first active region RX1 forms transistors PGLB and PDL1, wherein a second active region RX2 forms transistors PGLA and PDL2, wherein a third active region RX3 forms transistors PGRA and PDR3, and wherein a fourth active region RX4 forms transistors PGRB and PDR4.

7. The bitcell structure of claim 6, wherein at least one of the first active region RX1, second active region RX2, third active region RX3 and fourth active region RX4 includes an aspect ratio of the pass-down to pass-gate portions thereof less than or equal to about 1:1.25.

8. The bitcell structure of claim 6, wherein the bitcell structure includes at least one of:
   a first trench site TS1 extending between the first active region RX1 and the second active region RX2, and a first contact to gate CB1 positioned between the first active region RX1 and the second active region RX2 in the first direction and spaced from a third side of the bitcell structure that extends between the first and second sides thereof, wherein the first contact to gate CB1 and the first trench site TS1 form a first pass through for internal node connection; and
   a second trench site TS2 extending between the third active region RX3 and the fourth active region RX4, and a second contact to gate CB2 positioned between the third active region RX3 and the fourth active region RX4 in the first direction and spaced from a third side of the bitcell structure that extends between the first and second sides thereof, wherein the second contact to gate CB2 and the second trench site TS2 form a second pass through for internal node connection.

9. The bitcell structure of claim 6, wherein the bitcell structure includes at least one of:
   a first contact to source or drain CA1 extending between the first active region RX1 and the second active region RX2, and a first contact to gate CB1 positioned between the first active region RX1 and the second active region RX2 in the first direction and spaced from a third side of the bitcell structure that extends between the first and second sides thereof, wherein the first contact to gate CB1 and the first contact to source or drain CA1 form a first pass through for internal node connection; and
   a second contact to source or drain CA2 extending between the third active region RX3 and the fourth active region RX4, and a second contact to gate CB2 positioned between the third active region RX3 and the fourth active region RX4 in the first direction and spaced from a third side of the bitcell structure that extends between the first and second sides thereof, wherein the second contact to gate CB2 and the second contact to source or drain CA2 form a second pass through for internal node connection.

10. The bitcell structure of claim 6, wherein the first active region RX1 and the fourth active region RX4 form substantially the same size and shape and are symmetrically disposed along the relatively longer dimension of the substantially rectangular cell area about a midline extending through the middle of the relatively longer dimension of the substantially rectangular cell area, and wherein the second active region RX2 and the third active region RX3 form substantially the same size and shape and are symmetrically disposed along the relatively longer dimension of the substantially rectangular cell area about the midline.

11. The bitcell structure of claim 1 wherein the bitcell structure includes:
    at least one of a first pass through for internal node connection formed, in part, by a first contact to gate CB1;
    a first via connected to the first contact to gate CB1; and
    a metal layer including a first L-shaped metal portion connected with the first via, the first L-shaped metal portion defining a first portion that extends along a first direction extending from the first side to the second side of the bitcell structure, and a second portion that extends in a third direction extending from a third side to a fourth side of the bitcell structure that each extend between the first and second sides thereof.

12. A dual port static random access memory (SRAM) bitcell structure comprising:
    a substantially rectangular cell area such that a relatively longer dimension of the substantially rectangular cell area extends between a first side of the bitcell structure to a second side of the bitcell structure;
    pass-gate transistors PGLA and PGRA forming a first port;
    pass-gate transistors PGLB and PGRB forming a second port; and
    a latch formed of pull-up transistors PUL and PUR and pull-down transistors PDR and PDL configured to store a bit, the pull-down transistors PDL including a pair of parallel transistors PDL1 and PDL2, and the pull-down transistors PDR including a pair of parallel transistors PDR3 and PDR4,
    wherein a first active region RX1 forms transistors PGLB and PDL1, wherein a second active region RX2 forms transistors PGLA and PDL2, wherein a third active region RX3 forms transistors PGRA and PDR3, and wherein a fourth active region RX4 forms transistors PGRB and PDR4.

13. The bitcell structure of claim 12, wherein the first active region RX1 and the fourth active region RX4 form substantially the same size and shape and are symmetrically disposed along the relatively longer dimension of the substantially rectangular cell area about a midline extending through the middle of the relatively longer dimension of the substantially rectangular cell area, and wherein the second active region RX2 and the third active region RX3 form substantially the same size and shape and are symmetrically disposed along the relatively longer dimension of the substantially rectangular cell area about the midline.

14. The bitcell structure of claim 12, wherein the first active region RX1 is adjacent the first side of the bitcell structure, and the second active region RX2 is adjacent the first active region RX1 in a first direction extending from the first side to the second side of the bitcell structure, and wherein the fourth active region RX4 is adjacent the second side of the bitcell structure, and the third active region RX3 is adjacent the fourth active region RX4 in a the second direction extending from the second side to the first side of the bitcell structure.

15. The bitcell structure of claim 12, wherein the bitcell structure includes at least one of:
    a first trench site TS1 extending between the first active region RX1 and the second active region RX3, and a first contact to gate CB1 positioned between the first active region RX2 and the second active region RX3 in a first direction extending from a first side to a second side of the bitcell structure and spaced from a third side of the bitcell structure that extends between the first and second sides thereof, wherein the first contact to gate CB1 and the first trench site TS1 form a first pass through for internal node connection; and
    a first contact to source or drain CA1 extending between the third active region RX3 and the fourth active region RX4, and a second contact to gate CB2 positioned between the third active region RX3 and the fourth active region RX4 in a first direction extending from a first side to a second side of the bitcell structure and spaced from a third side of the bitcell structure that extends between the first and second sides thereof, wherein the second contact to gate CB2 and the first contact to source or drain CA1 form a second pass through for internal node connection.

16. The bitcell structure of claim 12 wherein the bitcell structure includes:
   at least one of a first pass through for internal node connection formed, in part, by a first contact to gate CB1;
   a first via connected with the first contact to gate CB1; and
   a metal layer including a first L-shaped metal portion connected with the first via, the first L-shaped metal portion defining a first portion that extends along a first direction extending from the first side to the second side of the bitcell structure and a second portion that extends in a second direction extending from a third side to a fourth side of the bitcell structure that extend between the first and second sides thereof.

17. A method comprising:
   providing a dual port static random access memory (SRAM) bitcell structure including:
      a substantially rectangular cell area having a relatively longer dimension extending between a first side of the bitcell structure to a second side of the bitcell structure;
      pass-gate transistors PGLA and PGRA forming a first port;
      pass-gate transistors PGLB and PGRB forming a second port; and
      a latch formed of pull-up transistors PUL and PUR and pull-down transistors PDR and PDL configured to store a bit,
      transistor PGLB being adjacent the first side of the bitcell structure, and transistor PGLA being adjacent transistor PGLB in a first direction extending from the first side to the second side of the bitcell structure,
      transistor PGRB being adjacent the second side of the bitcell structure, and transistor PGRA being adjacent transistor PGRB in a second direction extending from the second side to the first side of the bitcell structure, and
      pass-gate transistors PGLA, PGRA, PGLB and PGRB, pull-up transistors PUL and PUR and pull-down transistors PDR and PDL being formed on the same layer.

18. The method of claim 17, wherein pull-down transistors PDL include a pair of parallel transistors PDL1 and PDL2, and wherein pull-down transistors PDR include a pair of parallel transistors PDR3 and PDR4.

19. The method of claim 17, wherein a first active region RX1 forms transistors PGLB and PDL1, a second active region RX2 forms transistors PGLA and PDL2, a third active region RX3 forms transistors PGRA and PDR3, and a fourth active region RX4 forms transistors PGRB and PDR4, and wherein the first active region RX1, second active region RX2, third active region RX3 and fourth active region RX4 each include an aspect ratio of the pass-down to pass-gate portions thereof less than or equal to about 1:1.25.

* * * * *